(12) United States Patent
Lin et al.

(10) Patent No.: US 9,379,168 B2
(45) Date of Patent: Jun. 28, 2016

(54) TOUCH OLED DISPLAY PANEL AND DISPLAY DEVICE COMPRISING THE SAME

(71) Applicant: InnoLux Corporation, Miao-Li County (TW)

(72) Inventors: Li-Ming Lin, Miao-Li County (TW); Chih-Ming Liang, Miao-Li County (TW); Kuo-Liang Chuang, Miao-Li County (TW); Shu-Lan Chen, Miao-Li County (TW)

(73) Assignee: INNOLUX CORPORATION (TW)

( * ) Notice: Subject to any disclaimer, the term of this patent is extended or adjusted under 35 U.S.C. 154(b) by 180 days.

(21) Appl. No.: 14/074,993

(22) Filed: Nov. 8, 2013

(65) Prior Publication Data

US 2014/0145162 A1 May 29, 2014

(30) Foreign Application Priority Data

Nov. 23, 2012 (TW) .............................. 101143907 A

(51) Int. Cl.
*H01L 27/32* (2006.01)
*H01L 51/52* (2006.01)

(52) U.S. Cl.
CPC ........... *H01L 27/323* (2013.01); *H01L 27/3244* (2013.01); *H01L 51/5253* (2013.01); *H01L 51/5262* (2013.01)

(58) Field of Classification Search
None
See application file for complete search history.

(56) References Cited

U.S. PATENT DOCUMENTS 8,188,649 B2 * 5/2012 Sung et al. .................... 313/503
2010/0231528 A1 * 9/2010 Wolfe et al. ................... 345/173

FOREIGN PATENT DOCUMENTS

| TW | M350725 B | 2/2009 |
| TW | 201039218 A | 11/2010 |
| TW | 201220923 A | 5/2012 |

* cited by examiner

*Primary Examiner* — Kenneth B Lee, Jr.
(74) *Attorney, Agent, or Firm* — Bacon & Thomas, PLLC

(57) ABSTRACT

A touch organic light-emitting diode (OLED) display panel and a display device comprising the same are disclosed. The touch OLED display panel comprises: a thin film transistor (TFT) substrate; an OLED layer disposed on the TFT substrate; a substrate disposed on the OLED layer; a sensor layer disposed on the substrate; an optical functional layer having a transmittance of 50% to 80%; and a cover plate, wherein the optical functional film is disposed on a surface of the cover plate.

15 Claims, 3 Drawing Sheets

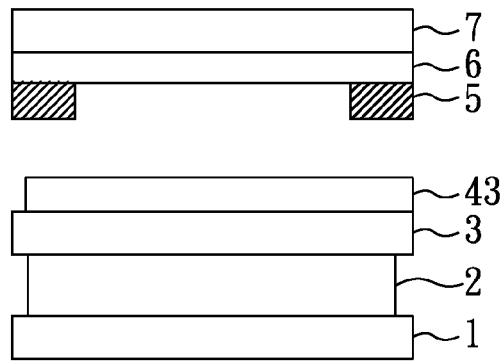 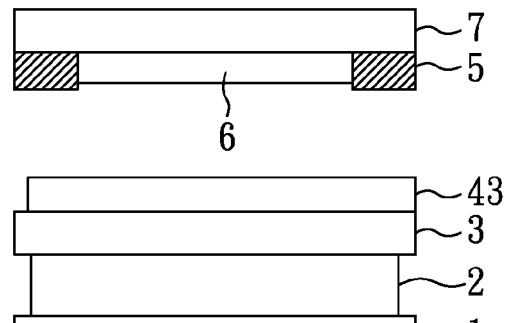
FIG. 3A    FIG. 3B
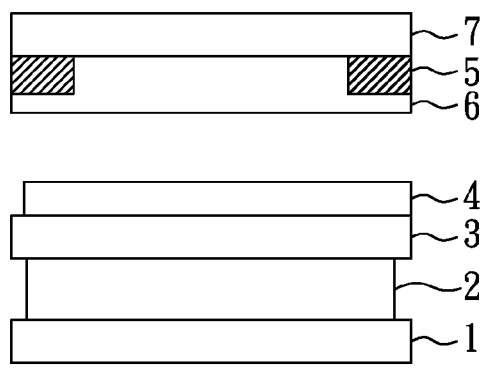 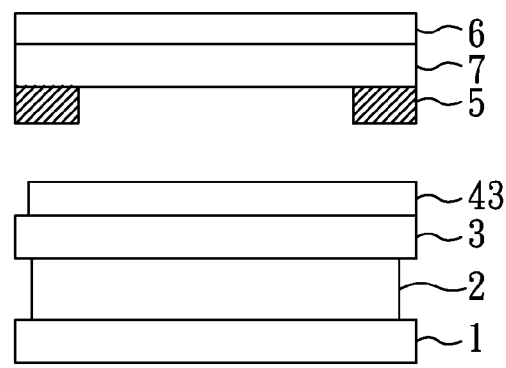
FIG. 3C    FIG. 3D

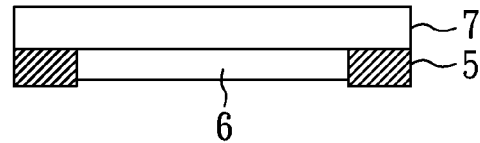
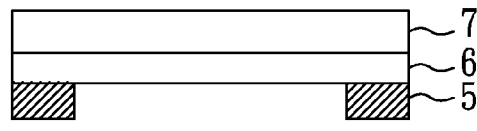
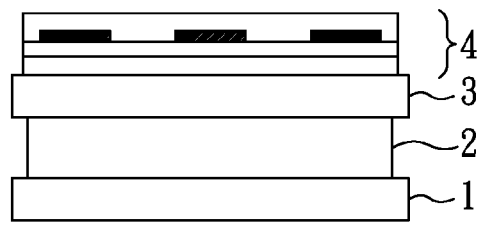
FIG. 4A
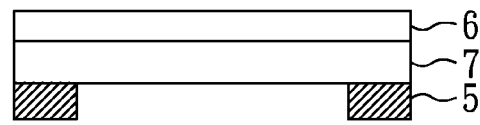
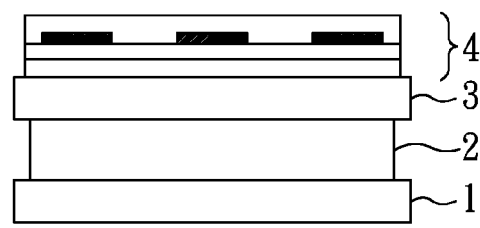
FIG. 4B
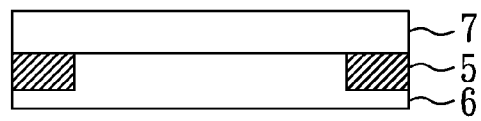
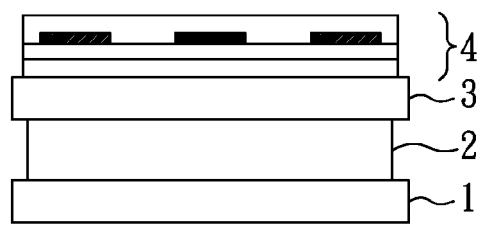
FIG. 4C
FIG. 4D

TOUCH OLED DISPLAY PANEL AND DISPLAY DEVICE COMPRISING THE SAME

CROSS REFERENCE TO RELATED APPLICATION

This application claims the benefits of the Taiwan Patent Application Serial Number 101143907, filed on Nov. 23, 2012, the subject matter of which is incorporated herein by reference.

BACKGROUND OF THE INVENTION

1. Field of the Invention

The present invention relates to a touch organic light-emitting diode (OLED) display panel and a display device comprising the same, and particularly to a touch OLED display panel which can greatly solve the issue of visibility of conductive lines and a display device comprising the same.

2. Description of Related Art

The touch panel technique may be divided into various types according to three main aspects: signal generating principle, sensing technique, and the way of screen assembly. According to the signal generating principle, it may be divided into digital type and analog type. The digital type touch panel employs a transparent indium tin oxide (ITO) conductive film, on which conductive lines are distributed along the directions of X axis and Y axis and a switch is formed at a crossover of the conductive lines. A touch signal is generated when a pressure is applied to the switch of the digital type touch panel. On the other hand, analog type is different from digital type by a dot spacer disposed between the upper and lower electrode layers. When a touch is applied to the analog type touch panel, the upper and lower electrode layers are connected to generate a signal representing the potential difference, which is then transferred to a controller by a circuit to process and calculate the coordinate position of the touch spot.

Furthermore, according to sensing technique, the touch panel technique may be divided into electric signal types (including resistance type, capacity type, electromagnetic type, and so on), light signal types (including infrared type and the like), and sound signal types (including surface acoustic wave type, acoustic waveguide type, chromatic dispersion signal type, sound pulse type, and so on). Among these techniques, resistance type, capacity type, surface acoustic wave type, infrared type, and electromagnetic type are most common.

In addition, in touch panel related industry, visibility of the internal conductive lines must be taken into consideration when manufacturing a sensing element. The visibility usually depends on a variety of factors, such as thickness, angle, material properties, stacking structure of material, and so on. Thus, it is difficult to determine visibility only by a single factor. Generally, an identical spectrum among the visible region (380-780 nm) can be obtained that the light passes through a same material and structure. Therefore, the visibility is attributed to the interference effect of a light passing through different materials and structures, giving different transmittance (T) and reflectance (R). In this case, reflectance (R) is a predominant factor, and a visibility difference ($\Delta R$) is caused by different light quantities reflected into human eyes. In most studies, $\Delta R < 1\%$ is defined as the criterion for determining whether it is noticeable or not.

Accordingly, what is needed to develop a display panel, which uses a structure and/or a special film to address the issue of the visibility of conductive lines.

SUMMARY OF THE INVENTION

An object of the present invention is to provide a touch organic light-emitting diode (OLED) display panel and a display device comprising the same to greatly solve the issue of the visibility of conductive lines of sensor layer.

To achieve above object, the present invention provides a touch organic light-emitting diode (OLED) display panel comprising: a thin film transistor (TFT) substrate; an OLED layer disposed on the TFT substrate; a substrate disposed on the OLED layer; a sensor layer disposed on the substrate; an optical functional layer having a transmittance of 50% to 80%; and a cover plate disposed on the sensor layer; wherein the optical functional film is disposed on a surface of the cover plate.

In the present invention, the thickness of the optical functional layer is not particularly limited, preferably 10 μm or less, and more preferably 5 μm to 10 μm, wherein the thickness may be adjusted if necessary. Also, a conventional material known in the art, for example, gray ink or gray photoresist may be used for the material of the optical functional layer, as long as it can achieve a transmittance of 50% to 80%. Preferably, a mixture of black and white materials is used to prepare the optical functional layer.

Furthermore, the touch organic light-emitting diode (OLED) display panel of the present invention may further comprise a dual-insulator disposed between the sensor layer and the substrate; and a protective layer disposed on the sensor layer, wherein the dual-insulator comprises a first insulator and a second insulator, and the second insulator is disposed between the first insulator and the sensor layer and has a refractive index of 1.6 to 1.7 and a thickness of 1500 Å to 4000 Å.

In the present invention, the materials of the first insulator and the second insulator are not particularly limited, and for example, the first insulator may be a silicon oxide (SiOx) layer and the second insulator may be a silicon oxynitride (SiOxNy) layer. In the case that the second insulator has a thickness of 1500 Å to 4000 Å, the thickness of the first insulator is not particularly limited, and preferably about 3000 Å.

In the present invention, the protective layer may be made of any conventional material, preferably a material having a refractive index similar to that of the second insulator. For example, when the second insulator is a silicon oxynitride layer, the protective layer is preferably a silicon oxynitride layer, too, or other materials having a refractive index of 1.6 to 1.7. Here, the protective layer may possess the properties of ion resistance or moisture resistance.

In addition, the material of the sensor layer of the present invention is not particularly limited, as long as it can achieve the purpose of sensing, for example, a common indium tin oxide (ITO) film having a refractive index of 1.8. Also, the thickness of the ITO film may be selected according to the actual process, and a thickness of 500 Å or 1100 Å is usually employed, for example. Although the common material and thickness have been described, they may be adjusted depending on the requirement of the product.

Accordingly, in selecting the above described materials and thickness for the insulator, flexibility, stress, electrostatic protection, transparency, color shift, adherence, or so on, of the materials may be taken into consideration.

Furthermore, the touch organic light-emitting diode (OLED) display panel of the present invention may further comprise an ink frame disposed on a surface facing the sensor layer of the cover plate; and the optical functional layer being disposed between the ink frame and the cover plate, surrounded by the ink frame, covering the ink frame, or disposed on a surface on which the ink frame is not formed.

Alternatively, the touch organic light-emitting diode (OLED) display panel of the present invention may improve visibility merely by a dual-insulator. Accordingly, the touch organic light-emitting diode (OLED) display panel comprises: a thin film transistor (TFT) substrate; an OLED layer disposed on the TFT substrate; a substrate disposed on the OLED layer; a dual-insulator disposed on the substrate; a sensor layer disposed on the substrate; a protective layer disposed on the sensor layer; and a cover plate disposed on the protective layer; wherein the dual-insulator comprises a first insulator and a second insulator disposed on the first insulator and having a refractive index of 1.6 to 1.7 and a thickness of 1500 Å to 4000 Å. Each of the layers is the same as described above.

In addition, the substrate disposed on the OLED layer may be a transparent substrate or may further comprise a color filter, depending on the case that the OLED layer is a RGB OLED layer or a white OLED layer.

The present invention may also provide a display device comprising: the above-described touch organic light-emitting diode (OLED) display panel; and a controller electrically connected to the touch organic light-emitting diode (OLED) display panel. Therefore, the display device can improve visibility thereof by the optical functional layer and/or the dual-insulator, to reduce a difference of visibility due to the interference effect of a light passing through different materials and structures.

Other objects, advantages, and novel features of the invention will become more apparent from the following detailed description when taken in conjunction with the accompanying drawings.

BRIEF DESCRIPTION OF THE DRAWINGS

FIGS. 3A to 3D show the display panels of Example 5 according to the present invention.

FIGS. 4A to 4D show the display panels of Example 6 according to the present invention.

DETAILED DESCRIPTION OF THE PREFERRED EMBODIMENT

Example 1

Figure 1:
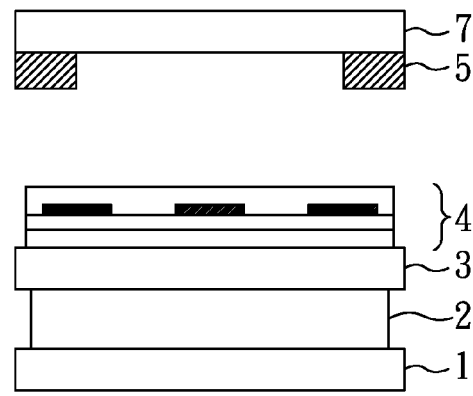
FIG. 1 shows the display panels of Examples 1 to 4 according to the present invention.
Figure 2:
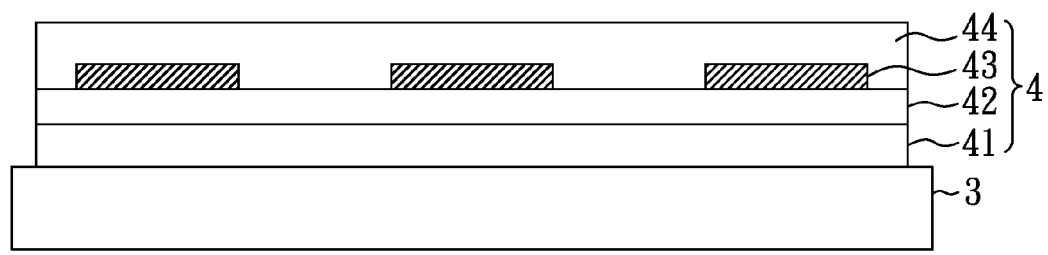
FIG. 2 is a magnified view of the dual-insulator in FIG. 1.

A display panel is manufactured as shown in FIG. 1. The display panel comprises a thin film transistor (TFT) substrate 1; an OLED layer 2 disposed on the TFT substrate 1; a substrate 3 disposed on the OLED layer 2; a dual-insulator 4 disposed on the substrate 3; an ink frame 5; and a cover plate 7. FIG. 2 shows a schematic view of the dual-insulator 4, wherein the dual-insulator 4 comprises a first insulator 41 and a second insulator 42 disposed on the first insulator 41; a sensor layer 43 disposed on the second insulator 42; and a protective layer 44 disposed on the sensor layer 43. It should be noted that the substrate 3 may be a transparent substrate or may further comprise a color filter depending on the case that the OLED layer is a RGB OLED layer or a white OLED layer.

The protective layer 44 is made of SiOxNy (n=1.7) having a thickness of 3000 Å; the first insulator 41 is made of SiOx (n=1.46) having a thickness of 3000 Å; the second insulator 42 is made of SiOxNy (n=1.7); and the sensor layer 43 having conductive lines is made of ITO having a thickness of 1100 Å.

Next, ΔR of the incident light at 550 nm in this structure is obtained by optical simulation, and the experimental data of average reflectance difference (ΔR) is listed in Table 1.

TABLE 1

| | | | | | | | | |
|---|---|---|---|---|---|---|---|---|
| 0° | | | | | | | | |
| thickness of the second insulator(Å) | 400 | 500 | 521 | 525 | 550 | 600 | 1000 | 1500 |
| \| ΔR average value \| | 1.367 | 1.1569 | 1.1091 | 1.0999 | 1.042 | 0.9245 | 0.1377 | 0.0193 |
| thickness of the second insulator(Å) | 1550 | 1561 | 1600 | 3000 | 3500 | 3512 | 3750 | 4000 |
| \| ΔR average value \| | 0.0764 | 0.09 | 0.1477 | 0.5805 | 0.174 | 0.1691 | 0.1687 | 0.4254 |
| 45° | | | | | | | | |
| thickness of the second insulator(Å) | 400 | 500 | 521 | 525 | 550 | 600 | 1550 | 1561 |
| \| ΔR average value \| | 4.1571 | 0.7274 | 0.0006 | 0.146 | 1.0234 | 2.7777 | 0.1985 | 0.0345 |
| thickness of the second insulator(Å) | 1600 | 3500 | 3512 | | | | | |
| \| ΔR average value \| | 0.85 | 0.1709 | 0.002 | | | | | |

Accordingly, among various thicknesses of the second insulator 42 under test, preferable thicknesses satisfying an improved visibility (ΔR average value<1) in a front view (0°) and a side view (45°) are: 521 Å, 1561 Å, and 3512 Å. In the following examples, the thickness ranging from 1000 to 4000 Å is selected for test to comply with the production process.

Example 2

A display panel having the same structure as that in Example 1 is manufactured, wherein the protective layer 44 is made of SiOxNy (n=1.64) having a thickness of 3000 Å; the first insulator 41 is made of SiOx (n=1.46) having a thickness of 3000 Å; the second insulator 42 is made of SiOxNy (n=1.64); and the sensor layer 43 is made of ITO having a thickness of 1100 Å.

Next, ΔR of the incident light at 550 nm in this structure is obtained by optical simulation, and the experimental data of average reflectance difference (ΔR) is listed in Table 2.

TABLE 2

| | 0° | | | | | | |
|---|---|---|---|---|---|---|---|
| thickness of the second insulator(Å) | 1000 | 1500 | 1650 | 1670 | 1672 | 1674 | 2000 |
| \|ΔR average value\| | 0.421448 | 0.052062 | 0.016143 | 0.032176 | 0.033864 | 0.035568 | 0.472711 |
| | 45° | | | | | | |
| thickness of the second insulator(Å) | 1650 | 1670 | 1672 | 1674 | | | |
| \|ΔR average value\| | 0.353017 | 0.064939 | 0.036127 | 0.007313 | | | |

Accordingly, among various thicknesses of the second insulator 42 ranging from 1000 to 4000 Å under test, a preferable thickness satisfying an improved visibility is 1674 Å.

Example 3

A display panel having the same structure as that in Example 1 is manufactured, wherein the protective layer 44 is made of SiOxNy (n=1.7) having a thickness of 3000 Å; the first insulator 41 is made of SiOx (n=1.46) having a thickness of 3000 Å; the second insulator 42 is made of SiOxNy (n=1.7); and the sensor layer 43 is made of ITO having a thickness of 500 Å.

Next, ΔR of the incident light at 550 nm in this structure is obtained by optical simulation, and the experimental data of average reflectance difference (ΔR) is listed in Table 3.

TABLE 3

| | 0° | | | | | |
|---|---|---|---|---|---|---|
| thickness of the second insulator(Å) | 1000 | 1500 | 1720 | 1726 | 1770 | 2000 |
| \|ΔR average value\| | 0.5620 | 0.5049 | 0.3095 | 0.297625 | 0.2039 | 0.3239 |
| | 45° | | | | | |
| thickness of the second insulator(Å) | 1720 | 1726 | 1770 | | | |
| \|ΔR average value\| | 0.1041 | 0.007971 | 0.6849 | | | |

Accordingly, among various thicknesses of the second insulator 42 ranging from 1000 to 4000 Å under test, a preferable thickness satisfying an improved visibility is 1726 Å.

Example 4

A display panel having the same structure as that in Example 1 is manufactured, wherein the protective layer 44 is made of SiOxNy (n=1.64) having a thickness of 3000 Å; the first insulator 41 is made of SiOx (n=1.46) having a thickness of 3000 Å; the second insulator 42 is made of SiOxNy (n=1.64); and the sensor layer 43 is made of ITO having a thickness of 500 Å.

Next, ΔR of the incident light at 550 nm in this structure is obtained by optical simulation, and the experimental data of average reflectance difference (ΔR) is listed in Table 4.

TABLE 4

| | 0° | | | | |
|---|---|---|---|---|---|
| thickness of the second insulator(Å) | 1000 | 1500 | 1837 | 1850 | 2000 |
| \|ΔR average value\| | 0.3421 | 0.4710 | 0.5397 | 0.5290 | 0.3614 |

TABLE 4-continued

| | 45° | |
|---|---|---|
| thickness of the second insulator(Å) | 1837 | 1850 |
| \|ΔR average value\| | 0.0265 | 0.1184 |

Accordingly, among various thicknesses of the second insulator 42 ranging from 1000 to 4000 Å under test, a preferable thickness to satisfying an improved visibility is 1837 Å.

According to the experimental results of Examples 1 to 4, the second insulator made of SiOxNy has a refractive index (n) of 1.6-1.7 and a thickness of 1500 Å to 4000 Å. In such a display panel structure, an improved visibility can be achieved at either a large or small viewing angle, according to the observation results at the range of \|ΔR\|<1%.

Example 5

A display panel is manufactured as shown in FIG. 3A. The display panel comprises a thin film transistor (TFT) substrate 1; an OLED layer 2 disposed on the TFT substrate 1; a substrate 3 disposed on the OLED layer 2; a sensor layer 43 disposed on the substrate 3; an ink frame 5; an optical functional layer 6; and a cover plate 7. The ink frame 5 is disposed on a surface facing the sensor layer 43 of the cover plate 7, and the optical functional layer 6 is disposed on a surface of the cover plate 7, that is, the optical functional layer 6 is disposed between the ink frame 5 and the cover plate 7. Here, the optical functional layer having a thickness of 5-10 μm and a transmittance of 50% to 80% is a gray layer, such as a gray photoresist layer or a gray ink layer, which is the mixture of a black material and a white material. It should be noted that the substrate 3 may be a transparent substrate or may further comprise a color filter depending on the case that the OLED layer is a RGB OLED layer or a white OLED layer.

In addition, as shown in FIGS. 3B to 3D, the optical functional layer may be surrounded by the ink frame (FIG. 3B), cover the ink frame (FIG. 3C), or be disposed on a surface on which the ink frame is not formed (FIG. 3D).

Accordingly, by the optical functional layer, the reflected light quantity (R) of the overall structure can be reduced, thereby obtaining a lower ΔR to improve the visibility of the sensor layer.

Example 6

A display panel is manufactured as shown in FIG. 4A. The display panel comprises a thin film transistor (TFT) substrate 1; an OLED layer 2 disposed on the TFT substrate 1; a substrate 3 disposed on the OLED layer 2; a dual-insulator 4 disposed on the substrate 3; an ink frame 5; an optical functional layer 6; and a cover plate 7. Wherein, the ink frame 5 is disposed on a surface facing the dual-insulator 4 of the cover plate 7, and the optical functional layer 6 is disposed on a surface of the cover plate 7, that is, the optical functional layer 6 is disposed between the ink frame 5 and the cover plate 7. Here, the optical functional layer has the properties as described in Example 5, and the dual-insulator has the properties as described in Examples 1 to 4. It should be noted that the substrate 3 may be a transparent substrate or may further comprise a color filter depending on the case that the OLED layer is a RGB OLED layer or a white OLED layer.

In addition, as shown in FIGS. 4B to 4D, the optical functional layer may be surrounded by the ink frame (FIG. 4B), cover the ink frame (FIG. 4C), or be disposed on a surface on which the ink frame is not formed (FIG. 4D).

In summary, the present invention can reduce the reflectance by the dual-insulator and the optical functional layer to resolve the problem of the sensor layer visibility.

Although the present invention has been explained in relation to its preferred embodiment, it is to be understood that many other possible modifications and variations can be made without departing from the spirit and scope of the invention as hereinafter claimed.

What is claimed is:

1. A touch organic light-emitting diode (OLED) display panel, comprising:
   a thin film transistor (TFT) substrate;
   an OLED layer disposed on the TFT substrate;
   a substrate disposed on the OLED layer;
   a sensor layer disposed on the substrate;
   a dual-insulator disposed between the sensor layer and the substrate, and the dual-insulator comprises a first insulator and a second insulator, wherein the second insulator is disposed between the first insulator and the sensor layer and has a refractive index of 1.6 to 1.7 and a thickness of 1500 Å to 4000 Å;
   a protective layer disposed on the sensor layer;
   an optical functional layer having a transmittance of 50% to 80%; and
   a cover plate disposed on the sensor layer,
   wherein the optical functional film is disposed on a surface of the cover plate.

2. The touch organic light-emitting diode (OLED) display panel of claim 1, wherein the optical functional layer has a thickness of 5-10 μm.

3. The touch organic light-emitting diode (OLED) display panel of claim 1, wherein the optical functional layer is a gray photoresist layer.

4. The touch organic light-emitting diode (OLED) display panel of claim 1, wherein the optical functional layer is a gray ink layer.

5. The touch organic light-emitting diode (OLED) display panel of claim 1, wherein the protective layer has a refractive index of 1.6 to 1.7.

6. The touch organic light-emitting diode (OLED) display panel of claim 1, wherein the first insulator is a silicon oxide film.

7. The touch organic light-emitting diode (OLED) display panel of claim 1, wherein the second insulator is a silicon oxynitride layer.

8. The touch organic light-emitting diode (OLED) display panel of claim 1, wherein the protective layer is a silicon oxynitride layer.

9. The touch organic light-emitting diode (OLED) display panel of claim 1, wherein the substrate further comprises a color filter.

10. The touch organic light-emitting diode (OLED) display panel of claim 1, further comprising: an ink frame disposed on a surface facing the sensor layer of the cover plate; and the optical functional layer being disposed between the ink frame and the cover plate, surrounded by the ink frame, covering the ink frame, or disposed on a surface on which the ink frame is not formed.

11. A touch organic light-emitting diode (OLED) display panel, comprising:
    a thin film transistor (TFT) substrate;
    an OLED layer disposed on the TFT substrate;
    a substrate disposed on the OLED layer;
    a dual-insulator disposed on the substrate;
    a sensor layer disposed on the dual-insulator;
    a protective layer disposed on the sensor layer; and
    a cover plate disposed on the protective layer,
    wherein the dual-insulator comprises a first insulator and a second insulator disposed on the first insulator and having a refractive index of 1.6 to 1.7 and a thickness of 1500 Å to 4000 Å.

12. The touch organic light-emitting diode (OLED) display panel of claim 11, wherein the second insulator is a silicon oxynitride layer.

13. The touch organic light-emitting diode (OLED) display panel of claim 11, wherein the protective layer has a refractive index of 1.6 to 1.7.

14. The touch organic light-emitting diode (OLED) display panel of claim 11, wherein the substrate further comprises a color filter.

15. A display device, comprising:
    a touch organic light-emitting diode (OLED) display panel of claim 1; and
    a controller electrically connected to the touch organic light-emitting diode (OLED) display panel.

* * * * *